United States Patent [19]

Mochizuki et al.

[11] 4,290,830
[45] Sep. 22, 1981

[54] METHOD OF SELECTIVELY DIFFUSING ALUMINIUM INTO A SILICON SEMICONDUCTOR SUBSTRATE

[75] Inventors: Yasuhiro Mochizuki; Sadao Okano; Takuzo Ogawa, all of Hitachi, Japan

[73] Assignee: Hitachi, Ltd., Tokyo, Japan

[21] Appl. No.: 85,234

[22] Filed: Oct. 16, 1979

Related U.S. Application Data

[63] Continuation of Ser. No. 887,250, Mar. 16, 1978, abandoned.

[30] Foreign Application Priority Data

Mar. 25, 1977 [JP] Japan ................................ 52/33095

[51] Int. Cl.³ .......................................... H01L 21/225
[52] U.S. Cl. ..................................... 148/187; 148/188
[58] Field of Search ............................... 148/187, 188

[56] References Cited

U.S. PATENT DOCUMENTS

| 3,928,095 | 12/1975 | Harigaya et al. | 148/187 X |
| 4,040,878 | 8/1977 | Rowe | 148/1.5 X |
| 4,050,967 | 9/1977 | Rosnowski et al. | 148/189 |
| 4,066,485 | 1/1978 | Rosnowski et al. | 148/187 X |
| 4,067,099 | 1/1978 | Ito et al. | 148/187 X |

Primary Examiner—G. Ozaki
Attorney, Agent, or Firm—Craig and Antonelli

[57] ABSTRACT

A method of diffusing selectively aluminium into a single crystal silicon semiconductor substrate for fabricating a semiconductor device comprises the steps of forming a diffusion source layer of aluminium having a predetermined thickness on at least one of the major surfaces of the substrate in a predetermined pattern, forming an oxide film of a predetermined thickness through oxidation over the surface of the diffusion source layer and the exposed surface of the substrate, and heating the substrate inclusive of the exposed surface thereof and the diffusion source layer thereby to diffuse aluminium into the substrate. The thickness of the oxide film is so selected as to suppress vaporization of the aluminium and at the same time to be used as a diffusion mask without giving rise to crystallization into a cristobalite structure. The method allows the pattern of boundary between the diffused regions and non-diffused regions as well as concentration profile of the diffused region to be controlled in a desired manner with a high accuracy.

8 Claims, 17 Drawing Figures

100µ

METHOD OF SELECTIVELY DIFFUSING ALUMINIUM INTO A SILICON SEMICONDUCTOR SUBSTRATE

This is a continuation of application Ser. No. 887,250, filed Mar. 16, 1978 now abandoned.

LIST OF PRIOR ART REFERENCES (37 CFR 1.56 (a))

The following references are cited to show the state of the art:
1. Japanese Patent Laid-Open Publication of Pat. Appln Laid-Open No. 120184/76
2. Japanese Patent Laid-Open Publication of Pat. Appln Laid-Open No. 2165/77

BACKGROUND OF THE INVENTION

The present invention relates in general to a method of manufacturing a semiconductor device and in particular to a method of selectively diffusing aluminium into a single crystal silicon substrate.

In general, there are known boron, aluminium, gallium, indium or the like for P-type dopants or impurities diffused in a single crystal silicon substrate. Among those elements, aluminium is the most useful dopant for forming a very deep diffusion layer in the silicon substrate, because aluminium exhibits the greatest diffusion coefficient upon being diffused into the silicon substrate. In effect, the diffusion coefficient of aluminium is ten or more times as great as that of boron and several times as great as that of gallium. Besides, the time required for diffusing aluminium in forming a diffusion layer of a predetermined depth amounts to only one-tenth or less of that required for the diffusion of boron and only a fragment of the time required for the diffusion of gallium. Additionally, aluminium is advantageous in respect of the fact that generation of distortions in the crystal lattice of silicon can be suppressed to a minimum and that interaction with other dopants is negligible. On the other hand, diffusion of aluminium into silicon brings about various difficulties in constructing a diffusion processing apparatus. Further, the masking effect of a silicon dioxide film can not be satisfactorily attained in the case of the diffusion of aluminium.

Attempts have been hitherto made to use a selective diffusion mask of materials other than silicon dioxide for the selective diffusion of aluminium into silicon. However, such attempts have not yet led to success. For the mask materials, there have been proposed a silicon nitride film, a metal oxide film such as alumina, semiconductor films or a composite film of these materials. However, such masking materials encounter difficulties in the manufacture of the desired mask and in the photo-etching process. Additionally, pin-holes and cracks are likely to be produced in the mask during the diffusion and aluminium is thus diffused through them. Further, aluminium tends to react with the mask material, thereby to make the after-treatment difficult. For these reasons, the hitherto proposed masks are not easily used for practical applications.

There is also known a method of doping a silicon substrate with aluminium from dots or buttons of aluminium or alloys thereof deposited on a surface of the silicon substrate. This process is referred to also as a temperature gradient zone melting method and has been developed from the technique of forming an alloy junction, which method is not thus inherently the selective diffusion method. At present, it is still impossible to control satisfactorily the boundary pattern between the regions to be doped with aluminium and those not to be doped as well as the concentration profile of the dopant.

SUMMARY OF THE INVENTION

An object of the invention is to provide a novel method of diffusing selectively aluminium in a single crystal silicon substrate only at desired regions.

Another object of the invention is to provide an improved aluminium selective diffusion method which allows the boundary between diffused and non-diffused regions to be controlled in a desired pattern and at the same time permits the impurity concentration profile in the diffused region to be controlled with high accuracy.

Still another object of the invention is to provide an aluminium selective diffusion method which is capable of forming a plurality of islands or wells in a silicon substrate as isolated by PN-junctions within a short time and with a high yield.

A further object of the invention is to provide an aluminium selective diffusion method which is capable of forming a plurality of aluminium-diffused regions in a silicon substrate which differ from one another in respect of the depth and concentration distribution, while the number of fabrication steps is reduced to a minimum.

In view of the above and other objects which will become more apparent as the description proceeds, there is proposed according to an aspect of the invention a method of selectively diffusing aluminium into a single crystal silicon semiconductor substrate for fabricating a semiconductor device, which comprises the steps of forming a diffusion source layer of aluminium having a predetermined thickness on at least one major surface of a single crystal silicon substrate in a predetermined pattern, forming oxide films of a predetermined thickness through oxidation over the surface of the diffusion source layer and the exposed surface of the substrate, and thermally treating the substrate including the exposed surface thereof and the diffusion source layer covered with the oxide film of the pre-determined thicknesses thereby to diffuse aluminium into the substrate, wherein the thickness of the oxide film formed on the surface of the diffusion source layer is selected to be sufficient for suppressing vapourization of aluminium, and wherein the thickness of the oxide film formed on the exposed surface of the substrate is so selected that the oxide film can serve as a diffusion mask, while no crystallization into a cristobalite structure may occur during the thermal treatment for diffusion.

According to another aspect of the invention, the oxidizing step is carried out simultaneously with the thermal treatment for diffusion, wherein the thermal treatment is effected in a gas flow of a non-oxidizing gas added with about 0.05 to 10% of oxygen gas.

According to another feature of the invention, the oxidizing step is carried out during an initial phase of the thermal treatment step for diffusion by subjecting the silicon substrate having the diffusion source layer of aluminium of a predetermined thickness and pattern formed thereon to an oxidizing atmosphere, while the substrate is placed in a non-oxidizing atmosphere during the remaining phase of the diffusion step.

According to still another feature of the invention, the aluminium diffusion source layer is formed of at least one selected from a group consisting of aluminium and aluminium-silicon alloys.

DESCRIPTION OF THE PREFERRED EMBODIMENTS

Figure 1A:
FIGS. 1a to 1d are sectional views of a silicon substrate to illustrate an example of the aluminium selective diffusion method according to the invention.

Now, description will be made on preferred embodiments or examples of the invention by referring to the drawings.

EXAMPLE 1

Figure 1B:
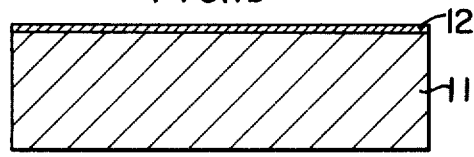
Figure 1C:
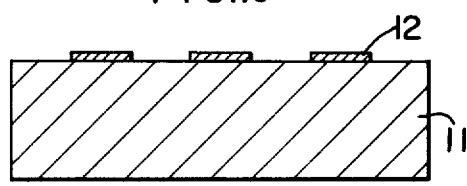
Figure 1D:
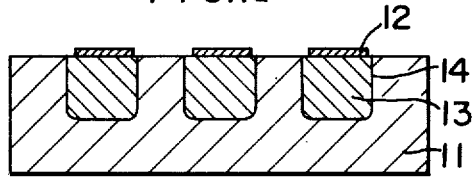

In FIG. 1a, reference numeral 11 denotes a single crystal silicon semiconductor substrate of N-conductivity type having a resistivity in the range of 100 to 110 $\Omega$-cm, crystallographic axis <111>, a diameter of 50 mm, a thickness in the range of 500 to 525 $\mu$m and being dislocation-free. Such substrate may be fabricated through a floating zone process and has at least one major surface polished to an optical quality. FIG. 1b shows the silicon semiconductor substrate having an aluminium layer formed on the major surface thereof through a vacuum evaporation process in which an aluminium wire having a purity of 99.9995% and used as the aluminium source was heated by an electron beam and deposition was performed at a pressure in the range of $2 \times 10^{-6}$ to $3 \times 10^{-6}$ Torr with the temperature of the silicon substrate being selected in the range of 230° to 250° C. The thickness of the evaporated aluminium layer was $1.0 \pm 0.1$ $\mu$m. FIG. 1c shows the aluminium layer 12 after having been etched so as to have a desired pattern through conventional photolithography. In the illustrated embodiment, the aluminium layer 12 was etched in a grid-like pattern composed of stripes having widths of 25, 50, 100, 250, 500 $\mu$m by using PAN etching solution (a mixture solution containing 720 ml of 85% phosphoric acid, 60 ml of glacial acetic acid, 30 ml of 69 to 71% nitric acid and 140 ml of water) at a solution temperature of 75° C. After the etching treatment, the silicon semiconductor substrate 11 was heated for 96 hours at 1250° C. in a diffusion furnace to diffuse aluminium into the silicon substrate from the aluminium source layer 12, whereby diffused regions 13 and PN-junctions 14 were formed as shown in FIG. 1d. In conjunction with the diffusion, it was noted that the atmosphere in which the diffusion is effected plays an important role. When the diffusion was carried out in an oxygen gas flow at a flow rate of 1.5 l/min, cracks were produced at portions where the silicon dioxide film formed on the surface of the silicon semiconductor substrate makes contact with the aluminium layer and resulted in the formation of diffused regions having lateral irregular extensions along the cracks. Such surface conditions of the silicon substrate can be seen from the photograph shown in FIG. 2a which was taken by a differential interference type microscope. In the photograph, those portions which appear in black are the diffused regions formed below the aluminium layer 12 of the grid-like pattern. Cracks were produced in the silicon dioxide film in the vicinity of the diffused regions. Examination with the aid of electron diffraction showed that such generation of cracks is ascribable to crystallization of the silicon dioxide film into cristobalite structure. In general, an oxygen gas atmosphere is often employed when an impurity is diffused into a silicon substrate through a so-called drive-in diffusion process in view of the fact that the silicon dioxide film formed during the diffusion can be used as a mask for a succeeding diffusion process. For example, the silicon dioxide film formed during a diffusion process to form a base region may be utilized as a mask for a succeeding diffusion to form an emitter region by doping with phosphorus. Upon diffusion of aluminium, the silicon dioxide film as formed will take in aluminium, because of the greater segregation tendency of aluminium at the interface between silicon and silicon dioxide film. Consequently, crystallization of the silicon dioxide to a cristobalite structure is highly promoted to produce remarkable stress or distortion in the surface region of the silicon substrate, as a result of which diffusion of aluminium proceeds laterally in the intergranular direction of the crystal, thereby to significantly degrade the pattern or dimensional accuracy. Such phenomenon will take place independently from the thickness and pattern size of the evaporated aluminium layer. On the other hand, it has been found that the drive-in diffusion of aluminium in the atmosphere of a non-oxidizing gas flow of nitrogen or argon at a flow rate of 1.5 l/min results in diffusion at regions where diffusion should not occur, making it impossible to attain the selective diffusion. It is believed that such unwanted diffusion is ascribable to the fact that aluminium is vapourized in the atmosphere of non-oxidizing gas flow and diffused into the silicon substrate in the gaseous (vapor) phase. On the other hand, the possibility of the selective diffusion in the atmosphere of oxidizing gas flow regardless of degraded pattern or dimensional accuracy may be explained by the fact that the surface of the aluminium layer undergoes oxidation to make vapourization of aluminium difficult and that the silicon dioxide film formed on the surface of the silicon substrate exhibits a masking effect for the diffusion of aluminium.

Studies and experiments have been made with a view to providing a method which allows diffusion of aluminium to be carried out without degrading the pattern or dimensional accuracy of the diffused regions due to crystallization into the cristobalite structure, while suppressing the vapourization of aluminium and taking advantage of the masking effect provided by the silicon dioxide film. In the first place, diffusion of aluminium was effected in the atmosphere of nitrogen gas flow (flow rate: 1.5 l/min) by adding thereto oxygen gas in amounts of 300 ml/min (17%), 165 ml/min (10%), 15 ml/min (1%), 3 ml/min (0.2%) and 0.7 to 0.8 ml/min (0.05%), respectively, by metering through a microflow meter. It has been found that the regions where diffusion should not occur are satisfactorily protected from any diffusion of aluminium when the diffusion atmosphere of gas flows of the above compositions are employed except for the gas flow containing 17% of oxygen, in which case cristobalite structure is produced in the grown silicon oxide film in the vicinity of the aluminium layer, resulting in the irregular lateral extensions of diffusion, as is in the case of the diffusion effected in the atmosphere of pure oxygen gas flow. It has been thus discovered that the diffusion of aluminium into the silicon substrate from the aluminium layer deposited thereon can be effected with satisfactory results in an atmosphere of non-oxidizing gas and oxygen gas, containing oxygen gas at a ratio of oxygen gas to non-oxidizing gas in the range of 0.05% to 10%.

Figure 3C:
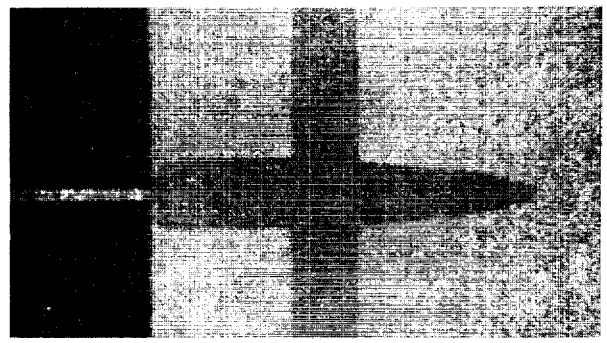
FIGS. 3a to 3c show photomicrographs of surfaces of silicon substrates angle lapped with an angle of 5°43' after having been subjected to the aluminium selective diffusion.
Figure 3B:
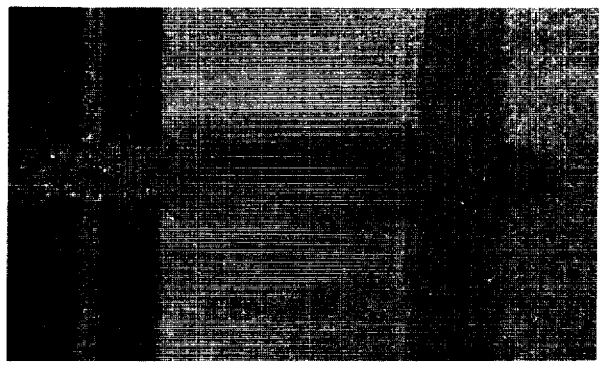
Figure 3A:
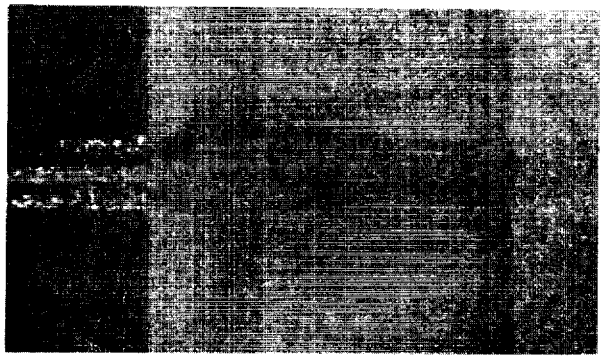

FIGS. 3a to 3c show photomicrographs of typical specimens of the silicon substrate doped with aluminium under the conditions described above. The silicon substrates were angle-lapped at respective edge portions with an angle of 5°43' and thereafter stained. The photographs shown in FIGS. 3a, 3b and 3c correspond to the silicon substrates diffused with aluminium in the atmospheres of non-oxidizing gas and oxygen gas containing 100%, 17% and 1% of oxygen, respectively. At an upper one-third portion of the photographs, there appear the aluminium layer and silicon surface in black together with cracks produced in the silicon dioxide film. The lower two-thirds portion of the photograph corresponds to the angle lapped and stained portion, wherein the dark gray area is a P-type region diffused with aluminium.

Figure 2B:
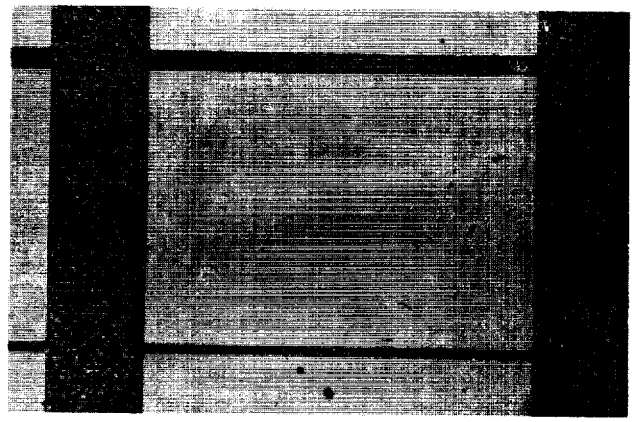
FIGS. 2a and 2b show photomicrographs of top surfaces of silicon substrates after having been subjected to the aluminium selective diffusion treatments.
Figure 2A:
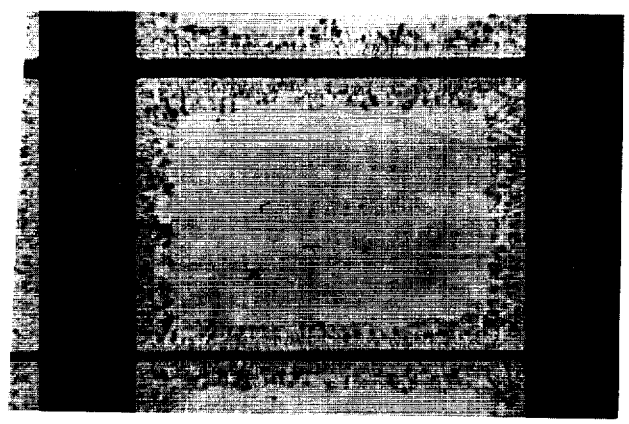

As a second method, the silicon semiconductor substrate deposited selectively with the aluminium layer was oxidized during the initial phase of diffusion. More specifically, the silicon substrate was placed in a diffusion furnace heated at 1250° C. and subjected to thermal treatment in an atmosphere of oxygen at first for 15 minutes and subsequently in an atmosphere of nitrogen gas flow for 95 hours and 45 minutes. Satisfactory results have been attained as in the case of the diffusion effected in the atmosphere containing a small amount of oxygen. The photograph of FIG. 2b taken with a differential interference type microscope shows the surface of a silicon substrate diffused with aluminium through the initial oxidation method described above. When compared with the photograph of FIG. 2a showing the silicon substrate which was subjected to thermal treatment in an atmosphere of oxidizing gas flow, no formation of cristobalite structure can be observed and at the same time dimensional accuracy of the diffusion pattern is apparently improved.

EXAMPLE 2

Examination was made on the influence of the thickness of the aluminium source layer deposited on the silicon substrate. The diffusion procedure was completely the same as in the case of Example 1 described hereinbefore in conjunction with FIGS. 1a to 1d. However, the thicknesses of the aluminium layer were selected at 0.1, 0.3, 1.0, 2.0, 3.0 and 8.0 $\mu$m, respectively. The diffusion was effected in an atmosphere of nitrogen gas flow at a rate of 1.5 l/min added with oxygen gas flow at a flow rate of 8 ml/min. It has been found that when the thickness of the aluminium layer exceeds 3.0 $\mu$m, streakings of the aluminium layer tend to be produced in the surface of the silicon substrate in the directions aligned with crystal orientation, thereby to disturb the pattern of selective diffusion. For example, such streakings of the aluminium layer is likely to occur in the directions <110> and <211> at a (111) plane, <110> at a (100) plane, <110> at a (110) plane, and in the directions <110> and <111> at a (211) plane. In the directions corresponding to the crystallographic axes <100>, <211>, <111> and <110>, the diffusion coefficients of aluminium are $6.29 \times 10^{-11}$, $6.30 \times 10^{-11}$, $6.49 \times 10^{-11}$ and $6.70 \times 10^{-11}$ cm$^2$/sec, respectively, at 1250° C. Dependence of the diffusion coefficient on the orientation of the crystal could not be observed. From the foregoing, it may be concluded that the thickness of the aluminium layer should be smaller than 2 $\mu$m and the disposition of the pattern should be aligned with the crystal orientation in order to attain an improved selective diffusion.

Figure 4:
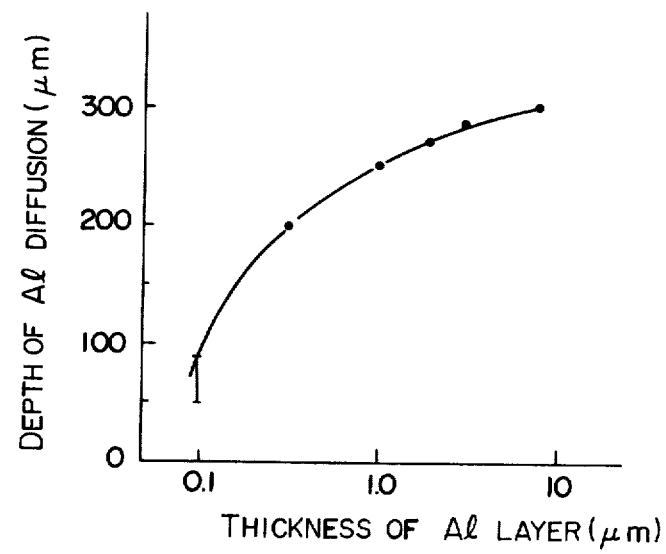
FIG. 4 is a graph to show a relationship between the thickness of the aluminium diffusion source layer formed through evaporation and the depth of aluminium diffusion.
Figure 5:
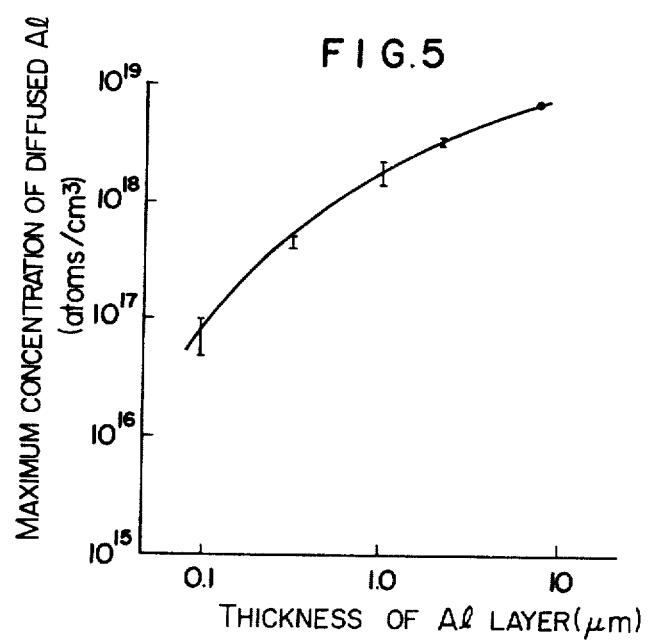
FIG. 5 shows graphically a relation between the thickness of the evaporated aluminium source layer and the maximum concentration of the aluminium-diffused layer.

It has been further found that the depth of diffusion of aluminium in the silicon substrate as well as the concentration of diffusion depends on the thickness of the deposited aluminium source layer. FIGS. 4 and 5 illustrate graphically variations of the depth of diffusion and the concentration of diffusion, respectively, as a function of the thickness of the aluminium layer under the condition that the diffusion is effected at 1250° C. for 96 hours. It will be seen that the diffusion depth and concentration can be controlled by varying the thickness of the deposited aluminium layer. However, a small thickness of the aluminium layer brings about unevenness in respect of the diffusion depth and concentration because of difficulty in controlling the deposition of aluminium layer of a small thickness and errors in measurement. To avoid such disadvantages, a silicon-aluminium alloy was deposited for the aluminium source on the silicon substrate through vacuum evaporation. When an eutectic alloy of silicon-aluminium is used, the diffusion depth and concentration which are substantially the same as those attained with aluminium of an amount equal to that of the aluminium content in the alloy can be attained with reduced unevenness.

EXAMPLE 3

In this example, the selective diffusion of aluminium in a silicon substrate according to the invention was applied to formation of isolation layers of PN-junctions. A silicon substrate of an N-conductivity type having a resistivity in the range of 100 to 110 $\Omega$-cm, crystal orientation (111), dislocation-free, a thickness of 520±10 $\mu$m and a diameter of 50 to 53.5 mm was prepared by a floating zone process. The silicon substrate was then deposited with aluminium layers of 1.0 $\mu$m in thickness at both of the major surfaces through vacuum evaporation. The aluminium layers were etched away in a grid-like pattern composed of stripes of 200 $\mu$m in width with a pitch or grid constant of 5.6 mm through a conventional photolithography. The directions in which the stripes extend were selected to coincide with the crystal axes <110> and <211>. The diffusion was effected at 1250° C. in an atmosphere of a mixed gas flow of nitrogen gas at a flow rate of 1.5 l/min and oxygen gas at a flow rate of 8 ml/min. After the thermal treatment for 110 hours, the diffused regions extended through the silicon substrate from both major surfaces to form a plurality of islands isolated from one another through PN-junctions in the N-type silicon substrate. After the thermal treatment for 150 hours, the maximum concentration of aluminium diffused in the silicon substrate was $2 \times 10^{18}$ atoms/cm$^3$, while the minimum concentration at a mid portion of the substrate was $2 \times 10^{16}$ atoms/cm$^3$. After the etching of the major surfaces of the silicon substrate thus obtained, passivation glass layers were formed on the etched surfaces and voltage blocking capability of the isolating regions between the N-type silicon islands was measured. It has been found that the isolating regions can block a voltage of 2.6 KV at a maximum and 2.2 KV on the average.

EXAMPLE 4

Figure 6A:
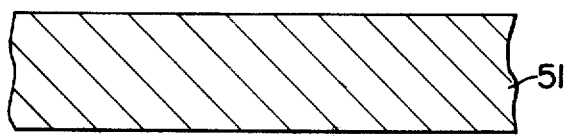
FIGS. 6a to 6f are sectional views of a silicon substrate to illustrate fabrication steps of a thyristor according to the teachings of the invention only by way of example.
Figure 6B:
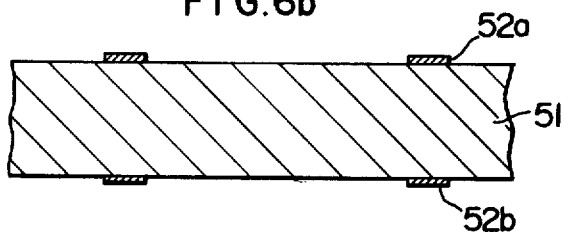

In this example, the selective diffusion of aluminium into a silicon semiconductor substrate according to the invention was applied to a fabrication of a thyristor of a semi-planar type with a single moat. Referring to FIG. 6a, numeral 51 denotes a silicon semiconductor substrate of N-conductivity type having a resistivity of 53 Ω-cm, dislocation-free, a crystal orientation (111), thickness of 230 μm and diameter of 50 mm, as prepared through the floating zone method. At the step shown in FIG. 6b, aluminium layers of 1.0 μm in thickness were deposited on both major surfaces of the substrate 51 through vacuum evaporation and aluminium layers 52a and 52b were formed through a photo-etching treatment. These aluminum layers 52a and 52b provide sources for selective diffusion of aluminium to form the isolation regions of PN-junctions and have a grid-like pattern composed of stripes extending orthogonally to each other in the directions of the crystallographic axes <110> and <211>. At the step shown in FIG. 6c, an aluminium-silicon alloy of 0.6 μm in thickness was deposited over the surfaces of the silicon substrate 51 inclusive of the selectively deposited aluminium layers 52a and 52b through vacuum evaporation. The aluminium-silicon layer at one major surface only was then subjected to a photo-etching treatment to form aluminium-silicon alloy layers 53a and 53b.

Figure 6C:
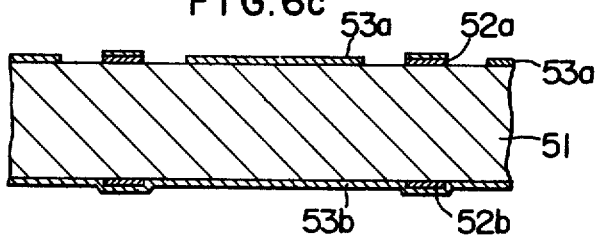
Figure 6D:
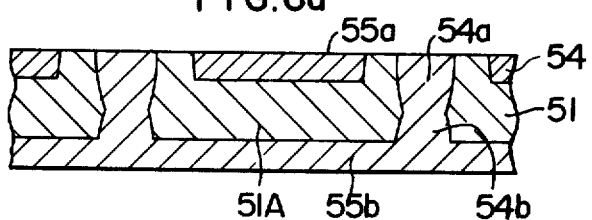
Figure 6E:
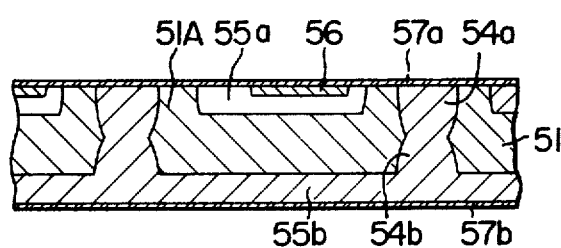
Figure 6F:
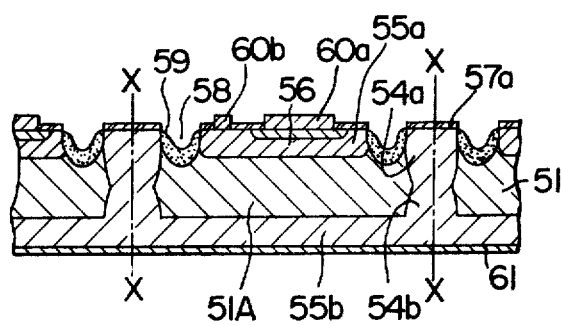

In the state shown in FIG. 6d, the substrate shown in FIG. 6c had been thermally treated at 1250° C. for 15 hours in an atmosphere of nitrogen gas flow containing 0.5% of oxygen, thereby to diffuse aluminium selectively into the silicon substrate from the aluminium layers 52a and 52b and the aluminium-silicon alloy layers 53a and 53b. There were formed simultaneously the selectively diffused isolation regions 54a and 54b of a PN-junction having a maximum concentration of ca. $2 \times 10^{18}$ atoms/cm$^3$, diffused regions 55a and 55b having a diffused depth of 40 μm and island 51A. At the step shown in FIG. 6e, the major surfaces of the silicon substrate were etched, oxidized, patterned through photolithography and diffused with phosphorus to form the N-type diffused region 56, thereby providing a PNPN-four-layered structure. Symbols 57a and 57b denote silicon dioxide films. In this state, the thickness of the N-type emitter region 56 was 9 μm, the thickness of the P-type base region 55a was 36 μm, the thickness of the N-type base region 51A was 140 μm and the thickness of the P-type emitter region 55b was 45 μm. At the step shown in FIG. 6f, moats 58 were formed through etching, and deposited with passivation glass 59 through electrophoresis and firing. Aluminium layers 60a and 60b were formed through vacuum evaporation to serve as cathode and gate electrodes, respectively, while the anode electrode is formed of a gold-gallium alloy layer 61. Subsequently, the semiconductor substrate was cut into pellets along the line X—X in the PN-junction regions selectively diffused with aluminium for isolation. A pellet thus obtained was bonded onto a supporting plate and the electrodes were connected to the respective leads through wire bonding. Thereafter, predetermined portions of the pellet and leads were embedded in a molded resin mass, thereby producing a thyristor. The forward blocking voltage of the thyristor thus fabricated was 1.1 KV, the reverse blocking voltage was 1.0 KV and forward voltage drop was 1.0 V with current density of 100 A/cm$^2$.

From the foregoing description, it will be appreciated that the invention has provided a method of diffusing selectively aluminium into a silicon semiconductor substrate with a high accuracy of diffusion profile and pattern in a simplified process to form diffused regions of a great depth in an extremely short time.

Many modifications and variations are possible on the illustrated embodiments without departing from the scope of the invention. For example, the vacuum evaporation and photolithography to form a pattern of the aluminium layer may be replaced by a sputtering method, CVD method, ion plating process or the like. The alloy containing aluminium as the main component may contain germanium, tin or the like substance instead of silicon, thereby to control the diffusion concentration and depth. Besides, other dopants such as boron, gallium, phosphorus or the like which exhibit a relatively low diffusion rate may be used in addition to aluminium to form a diffused profile having a two step distribution of impurity concentrations.

We claim:

1. A method of selectively diffusing aluminium into a single crystal silicon semiconductor substrate for fabricating a semiconductor device comprising the steps of:
    forming a diffusion source layer for aluminium diffusion into said substrate, said diffusion layer having a predetermined thickness, on at least one major surface of said crystal silicon semiconductor substrate in a predetermined pattern; and
    thermally treating said silicon semiconductor substrate having the diffusion source layer thereon to selectively diffuse aluminium into said substrate, said thermally treating step comprising: (a) a first step of subjecting said crystal silicon semiconductor substrate having said diffusion source layer thereon to oxidation by exposing said substrate to an atmosphere of oxygen, and (b) a subsequent second step of exposing said substrate to a non-oxidizing atmosphere, whereby aluminium is selectively diffused into said substrate without formation of cristobalite.

2. A method according to claim 1, wherein the thickness of said diffusion source layer is equal to or less than 2 μm.

3. A method according to claim 1, wherein said diffusion source layer for aluminium is an aluminium layer.

4. A method according to claim 1, wherein a period of time required for said first step is shorter than a period of time required for said second step.

5. A method according to claim 1, wherein said non-oxidizing atmosphere is 100% nitrogen gas.

6. A method according to claim 1, wherein said atmosphere of oxygen is an atmosphere of substantially 100% oxygen.

7. A method according to claim 1 or 6, wherein said non-oxidizing atmosphere is a non-oxidizing and non-reducing atmosphere.

8. A method according to claim 1, wherein the thermally treating step is at a temperature of around 1250° C.

* * * * *